United States Patent
Gendai (10) Patent No.: US 8,120,400 B2
(45) Date of Patent: Feb. 21, 2012

(54) PHASE LOCKED LOOP CIRCUIT

(75) Inventor: Yuji Gendai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/801,644

(22) Filed: Jun. 18, 2010

(65) Prior Publication Data

US 2011/0001524 A1     Jan. 6, 2011

(30) Foreign Application Priority Data

Jul. 1, 2009   (JP) ................................ 2009-157256

(51) Int. Cl.
*H03L 7/06*     (2006.01)
(52) U.S. Cl. ........ 327/159; 327/150; 327/156; 327/163; 331/17; 331/1 A; 375/376
(58) Field of Classification Search .................. 327/147, 327/150, 156, 159, 162, 163; 331/1 R, 17, 331/18, 1 A; 375/373, 376
See application file for complete search history.

(56) References Cited

U.S. PATENT DOCUMENTS

| | | | |
|---|---|---|---|
| 3,141,982 A | 7/1964 | Smith | |
| 6,144,261 A * | 11/2000 | Goto et al. | ........................ 331/17 |
| 6,236,343 B1 * | 5/2001 | Patapoutian | .................... 341/111 |
| 7,634,040 B1 * | 12/2009 | Yang et al. | ...................... 375/376 |
| 7,825,739 B2 * | 11/2010 | Higashino | ......................... 331/17 |

* cited by examiner

*Primary Examiner* — Patrick O'Neill
(74) *Attorney, Agent, or Firm* — Rader, Fishman & Grauer PLLC (57) ABSTRACT

A Phase Locked Loop circuit, includes: a main path through which an input signal is propagated, and an actual signal is output; a main feedback path through which the actual signal is fed back to an input stage of the main path; and a local feedback path through which feedback is carried out from a path middle of the main path to a path middle of an input stage side; the main path including a phase detector, a loop filter, and a controlled oscillator, and the local feedback path including a replica portion, a delay portion, a first subtracter, and a second subtracter.

6 Claims, 6 Drawing Sheets

PHASE LOCKED LOOP CIRCUIT

BACKGROUND OF THE INVENTION

1. Field of the Invention

The present invention relates to a Phase Locked Loop (PLL) circuit, and more particularly to a PLL circuit containing therein dead time.

2. Description of the Related Art

The evolution of signal processing from analog to digital results in that complicated processing which had been difficult to carry out is realized in related art, and problems in process variation are fundamentally dissolved.

On the other hand, however, the signal processing based on the digital implementation has a tendency to increase delay due to the digital processing.

Although this increase is not a problem so much when a signal flows in one direction, in loop processing in the PLL or the like, a system is easy to become instable.

In a control theory, this delay is referred to as "dead time," and is distinguished from "delay time" which occurs in a low-pass filter or the like.

The PLL containing the dead time in the loop appears in various kinds of actual applications such as storage, a communication or a broadcasting.

As well known in the control theory, this dead time causes the loop characteristics to be unstable, and deteriorates stabilization characteristics.

A Smith method has been known from time immemorial as a method of compensating for the dead time in the loop. The Smith method is disclosed in U.S. Pat. No. 3,141,982, Filed on Jan. 6, 1960, Patented on Jul. 21, 1964, "CONTROL SYSTEM FOR USE IN CONTROL OF LOOPS WITH DEAD TIME" by Otto J. M. Smith.

SUMMARY OF THE INVENTION

However, the Smith method supposes a feedback control system for a plant, and thus cannot be used in the PLL circuit as it is.

With regard to one of the difficulties resulting from the use application of the Smith method, a control amount is a virtual amount called as "a phase," and thus steadily increases with time. The Smith method is a system based on the premise of following a step-like input change, and thus cannot be applied to a ramp input.

Another problem about the Smith method is such that a Voltage Controlled Oscillator (VCO) (or a mechanism corresponding to the VCO) as a constituent element of the PLL circuit operates as a perfect integrator. Since the Smith method compensates for the dead time by using a replica of the object of the control, it is deduced that the Smith method cannot be used in such an unstable system.

The extension of the Smith method for the lossless integrator system has been variously tried. One extension of the Smith method for the lossless integrator system, for example, is described in M. R. Matausek and A. D. Micic, "A modified Smith Predictor for controlling a process with an integrator and long dead-time," IEEE Trans. on Automatic Control, Vol 41, No. 8, pp. 1199 to 1203, August 1996 (hereinafter referred to as Non-Patent Document 1).

However, the method proposed by M. R. Matausek and A. D. Micic is also limited to the control object falling under the same category as that supposed by Otto J. M. Smith. Thus, the method proposed by M. R. Matausek and A. D. Micic cannot cope with the ramp input which endlessly increases such as phase in the PLL circuit. In addition, any tries to apply the Smith method to the PLL containing therein the dead time have not been found out until now.

On the other hand, a method originating from the different idea is disclosed in U.S. Pat. No. 6,236,343, Filed on May 13, 1999, Patented on May 22, 2001, "Loop Latency compensated PLL," by A. Patapoutian. This method is such that a configuration of a Kalman Predictor is applied to the PLL circuit, and thus is a superior method in principle. However the Kalman Predictor itself is merely an estimation mechanism, and thus how the loop characteristics are designed remains as another problem.

In addition, any descriptions on an overflow problem for an internal description of phase which infinitely increases is not found out.

Hereinafter, a problem when the Smith method is simply applied to the PLL circuit will be discussed in detail.

When the loop characteristics of the PLL circuit is discussed, usually, a block diagram is used in which steadily increasing phase is omitted. The reason for this is because although the phase of the input signal increases approximately at a constant frequency, since the PLL forms a closed loop so as to control a phase difference between the input signal and the VCO to be zero, the phase of the VCO also increases at the rate approximately equal to that in the input signal, all it takes is only the phase error in the response characteristics matters.

Figure 1:
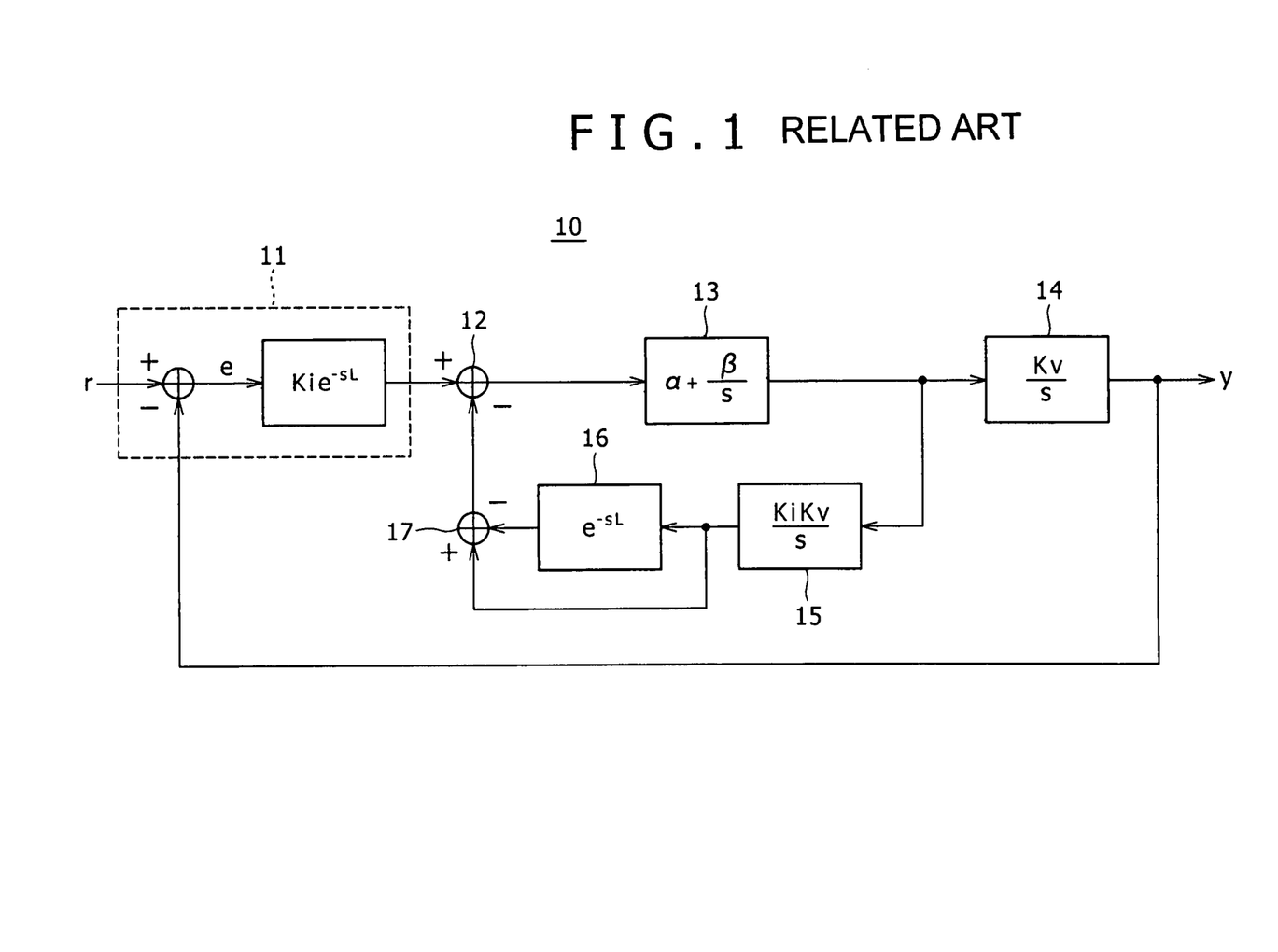
FIG. 1 is a block diagram, partly in circuit, showing a control system in which dead time compensation is provided in the form of being close to the original of a Smith method for a PLL model in which omission is carried out.

FIG. 1 is a block diagram showing a control system in which the dead time compensation is applied to the PLL model in the form close to the original Smith method in which such omission described above is taken.

The PLL model 10 has a phase detector 11, an adder (subtracter) 12, a loop filter 13, and a Voltage Controlled Oscillator (VCO) 14 in a main path. Also, this PLL model 10 has an integrator 15, a delay block 16, and an adder (subtracter) 17 in a local path.

It is a part of the phase detector 11 to provide a bridge between the virtual phase signal and the real phase error signal managed by the PLL.

Since the dead time is tend to occur in the phase detector 11, in the model shown in FIG. 1, the dead time is concentrated on the phase detector 11. Actually, the dead time decentrally occurs in various places in the loop.

In addition, according to the original of the Smith method, the dead time is concentrated on the VCO portion rather than the phase detector 11. However, it is obvious to be able to result in such a form through an equivalent transformation (the technique of the equivalent transformation is widely known by those skilled in the art).

The adder 12 disposed in the subsequent stage of the phase detector 11 is a path for compensating for the dead time. A description thereof will be given later.

The loop filter 13 is disposed in a subsequent stage of the adder 12, and thus is a control module for the response characteristics of the loop of the PLL. Also, the VCO 14 is controlled in accordance with an output signal from the loop filter 13.

The VCO 14 is a module in which an output phase is changed in accordance with an input voltage, and thus can be conceptually interpreted as a function of outputting a signal having a designated phase by a control input as a frequency. Thus, the VCO 14 is expressed as the perfect integrator in the block diagram because the input and output thereof are coupled in relationship thereof through an integral arithmetic operation. The output signal from the VCO 14 is fed back to the phase detector 11, thereby closing the control loop.

It is noted that the signals from the output signal from the phase detector 11 to the input signal to the VCO 14 are signals which really exist in the actual PLL as well.

Although the VCO 14 sometimes becomes a Current Controlled Oscillator (ICO) or otherwise becomes a Numerically Controlled Oscillator (NCO) which is directly controlled in accordance with a digital signal, the distinction between them needs not to be cared in this discussion.

While the above is the ordinary block configuration of the PLL circuit, a local feedback between the loop filter 13 and the VCO 14 is a dead time compensation system based on the Smith method.

In the dead time compensation system, the integrator 15 corresponding to a replica is firstly disposed. KiKv as an integral gain is made to match the loop gain of the main PLL rather than is made to correspond exactly to the gain of the VCO 14 of the main body. In principle, all it takes is that the gain of the local feedback, and the circuit loop gain of the main system are the same with each other. Therefore, a change where a gain stage is placed in the local loop is so flexible as to the convenience of the implementation.

Another difference between the replica VCO and the main VCO is described as follows.

That is to say, in the actual PLL, the main VCO 14 is an oscillator which oscillates at a free-run frequency. However, the replica of the VCO is not realized as an oscillator, but is realized either as a pure integrator as shown in the block diagram, or as an accumulate adder (accumulator) in the case of a discrete system.

Simulating the free-run frequency in the replica VCO is completely useless.

In a delay stage placed after the replica VCO, a delay amount is made to correspond to a circuit delay amount of the main PLL loop. Also, a difference between the portion in the preceding stage of the delay stage, and the portion in the subsequent stage of the delay stage is fed back to the main loop as shown in FIG. 1, thereby making it possible to compensate for the dead time. This is the idea of the Smith method. The input/output characteristics of this system are calculated as expressed by Expression (1):

$$\frac{y}{r} = \frac{KiKv(\alpha s + \beta)\exp(-sL)}{s^2 + KiKv(\alpha s + \beta)} \quad (1)$$

Here, a dead time factor, exp(−sL), is not included in a denominator. Since the property represented by the denominator is the same as that in the PLL not containing therein the dead time, the same discussion as that in the ordinary PLL can be carried out with respect to the response and the stability. However, since a relationship between a linear range of the phase detector, and a PLL pull-in range ought to be influenced by the dead time, there is no way that the completely same discussion has to be made. Since this relationship is not theoretically understood so well, this relationship is confirmed by carrying out the simulation or the like in a phase of the design. This dead time compensation system successfully functions by simulations.

However, when this dead time compensation system is applied to the actual control PLL circuit, in the case where there is a frequency error between the input frequency and the free-run frequency of the VCO, there is caused such a problem that a phase difference does not converge into zero.

This stems from that the frequency error remains as a constant value of the input of the VCO. This constant value is integrated by the replica VCO to turn into a ramp signal and to turn into a difference between the portion in the preceding stage of the delay stage, and the portion in the subsequent stage of the delay stage, thereby creating an offset proportional to a product of a ramp slope of the ramp signal, and a delay amount in an output from a difference circuit. Since there is an integral term in the loop filter 13, an input to the loop filter 13 need to converge into zero. Therefore, the stabilization is obtained in a state in which the phase offset enough to match the output signal from the difference circuit is output from the phase detector.

In addition, since the ramp signal as the output signal from the replica VCO has a property of endlessly increasing, even when any kind of signal expression is used, it may be impossible to avoid the overflow in principle. Speaking by changing a point of view, in the PLL in which the dead time is taken into consideration, the phase itself needs to be explicitly managed.

Summarizing the foregoing, when the Smith method is applied to the PLL circuit, it is necessary to solve the following two problems:

(1) The phase offset generated by the dead time compensation (2) The overflow of the ramp signal generated in the output signal from the replica VCO The present embodiment has been made in order to solve the problems described above, and it is therefore desirable to provide a PLL circuit in which dead time within a loop is compensated for, and thus desired characteristics can be obtained.

In order to attain the desire described above, according to an embodiment of the present invention, there is provided a PLL circuit including: a main path through which an input signal is propagated, and an actual signal is output; a main feedback path through which the actual signal is fed back to an input stage of the main path; and a local feedback path through which feedback is carried out from a path middle of the main path to a path middle of an input stage side. The main path includes: a phase detector disposed in the input stage for detecting phases of the input signal and the actual signal; a loop filter disposed on an output side of the phase detector; and a controlled oscillator for oscillating at a frequency corresponding to an output signal from the loop filter to generate an oscillation signal, thereby outputting the oscillation signal as the actual signal to the main feedback path. The local feedback path includes: a replica portion to which an output signal from the loop filter is input, and which functions as a replica of the controlled oscillator; a delay portion for delaying an output signal from the replica portion by circuit dead time; a first subtracter for obtaining a difference between an input signal to the delay portion, and an output signal from the delay portion; and a second subtracter for subtracting a signal obtained by multiplying an internal signal within the loop filter by a constant value from an output signal from the first subtracter thereby outputting a resulting signal to the input side of the loop filter.

According to another embodiment of the present invention, there is provided a PLL circuit including: a main path through which an input signal is propagated, and an actual signal is output; a main feedback path through which the actual signal is fed back to an input stage of the main path; and a local feedback path through which feedback is carried out from a path middle of the main path to a path middle of an input stage side. The main path includes: a phase detector disposed on the input stage for detecting phases of the input signal and the actual signal; an adder disposed on an output side of the phase detector for adding an output signal from the phase detector, and a feedback signal propagated through the local feedback path to each other; a first subtracter disposed on an output side of the adder for subtracting a signal before delay is carried out in the local feedback path by circuit dead time from an output signal from the adder; a loop filter disposed on an output side of the first subtracter; and a controlled oscillator for oscillating at a frequency corresponding to an output signal from the loop filter to generate an oscillation signal, thereby outputting the oscillation signal as the actual signal to the main feedback path. The local feedback path includes: a replica portion which functions as a replica of the controlled oscillator, and which outputs a part of an output signal thereof to the first subtracter of the main path; a delay portion for delaying an output signal from the replica portion by circuit dead time, and outputting a resulting output signal to the adder of the main path; and a second subtracter for outputting a signal obtained by subtracting a signal corresponding to an output signal from the adder from an output signal from the loop filter of the main path to the replica portion.

As set forth hereinabove, according to the present embodiment, it is possible to provide the PLL circuit in which the dead time within the loop is compensated for, and thus desired characteristics can be obtained.

DETAILED DESCRIPTION OF THE PREFERRED EMBODIMENTS

The preferred embodiments of the present invention will be described in detail hereinafter with reference to the accompanying drawings.

Figure 2:
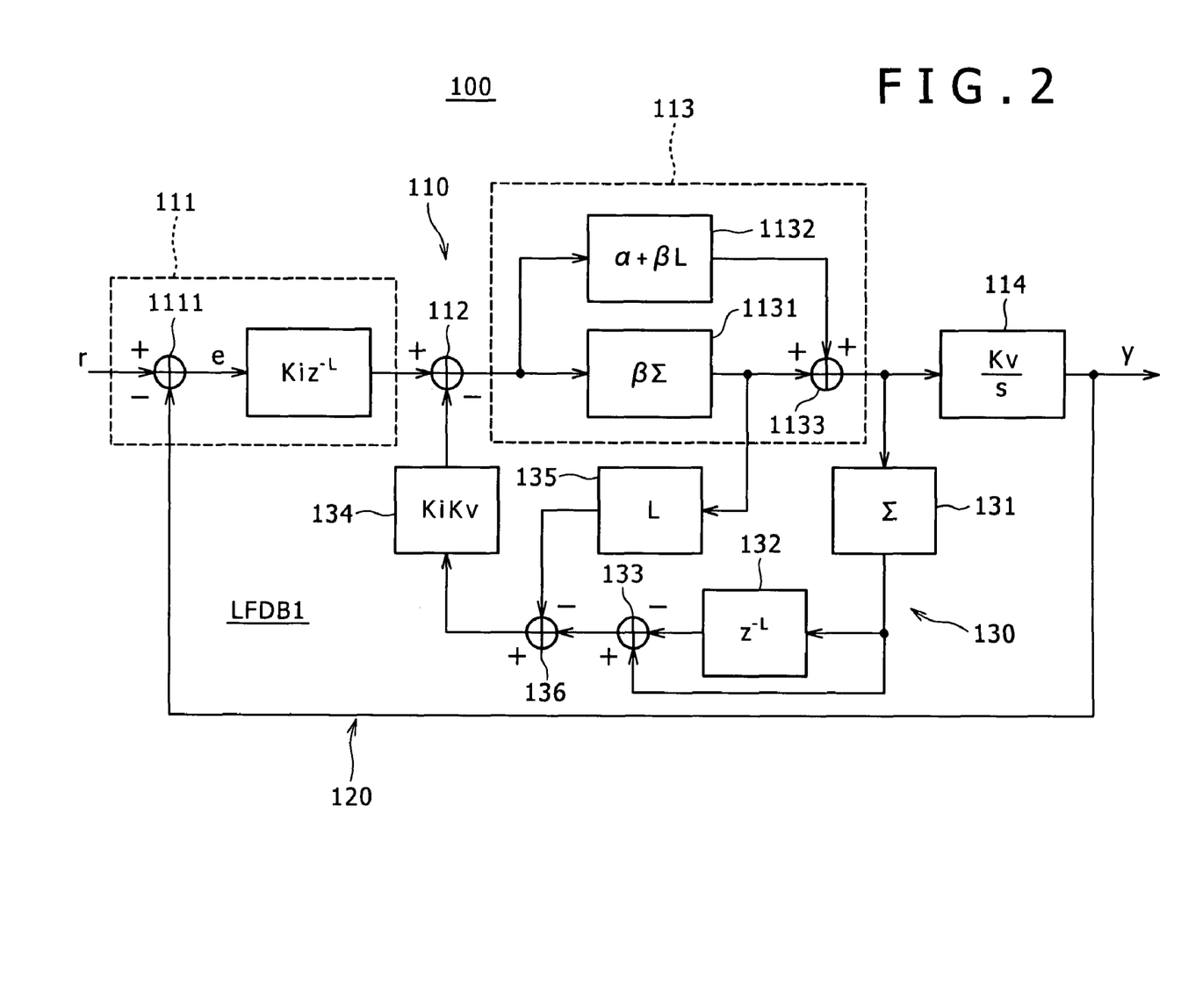
FIG. 2 is a block diagram, partly in circuit, showing a configuration of a PLL circuit according to a first embodiment of the present invention.

It is noted that the description will be given below in accordance with the following order.
1. First Embodiment of PLL circuit
2. Second Embodiment of PLL circuit 1. First Embodiment of PLL Circuit FIG. 2 is a block diagram, partly in circuit, showing a configuration of a PLL circuit according to a first embodiment of the present invention.

The PLL circuit 100 according to the first embodiment of the present invention has such a configuration that a system for compensating for a ramp output signal from a replica portion (replica VCO) generated based on a difference between an input frequency and a VCO free-run frequency is added in order to dissolve the shortcoming of the Smith method.

Although the various kinds of compensating methods are possible, methods of carrying out the compensation without degrading the original response characteristics of the Smith method are few.

One of the compensating methods is such that a stationary difference between a portion in a preceding stage of a delay circuit and a portion in a subsequent stage of the delay circuit is estimated, and nullify the difference. The first embodiment is shown as a preferred embodiment based on this idea in FIG. 2.

Since the PLL circuit having this configuration is partially identical to the Kalman Predictor, it is referred to as "a Kalman type PLL circuit."

The PLL circuit 100 of the first embodiment is configured so as to include a signal processing system for compensating for dead time.

The PLL (Phase Locked Loop) circuit 100 includes a main path 110, a main feedback path 120, and a local feedback path 130, and is configured in the form of a negative feedback type signal processing system having the dead time within the loop.

A feedback loop LFDB1 is composed of the main path 110 and the main feedback path 120.

In the main path 110, a phase detector 111, an adder (subtracter) 112, a loop filter 113, and a VCO 114 as a controlled oscillator are disposed in this order from an input side of an input signal r.

Also, an output signal (actual signal) y from the VCO 114 is fed back to an adder (subtracter) 1111 provided in the phase detector 111 through the main feedback path 120.

The phase detector 111 detects a phase of the input signal r, and a phase of the actual signal y.

The loop filter 113 has a function of controlling the response characteristics of the loop, and thus includes a portion 1131 for obtaining an integral term ($\beta\Sigma$), a portion 1132 for obtaining a proportional term ($\alpha+\beta L$), and an adder 1133 for adding the integral term and the proportional term to each other, thereby outputting a resulting addition signal.

It, is noted that $\beta L$ in the proportional term presents a correction term.

The VCO 114 oscillates at a frequency corresponding to the output signal from the loop filter 113 to generate an oscillation signal, and outputs the oscillation signal as an actual signal to each of a signal processing system (not shown) in a subsequent stage, and the main feedback path 120.

The local feedback path 130 includes a replica integrator (replica portion) 131, a delay circuit 132, and a subtracter (first subtracter) 133. In this case, the replica integrator 131 corresponds to a replica of the VCO 114. The delay circuit 132 delays an output signal from the replica integrator 131 by circuit dead time. Also, the subtracter 133 obtains a difference between an output signal from the replica integrator 131, and an output signal from the delay circuit 132.

The local feedback path 130 includes an amplitude adjusting portion 134 for feeding a signal having an adjusted amplitude back to an input terminal of the loop filter 113 through the adder 112 in the preceding stage of the loop filter 113.

The local feedback path 130 further includes a constant multiplication circuit 135, and a subtracter (second subtracter) 136. In this case, the constant multiplication circuit 135 multiplies the integral term ($\beta\Sigma$) in the portion 1131 of the loop filter 113 by a constant value L. Also, the subtracter 136 subtracts the output signal from the constant multiplication circuit 135 from the output signal from the subtracter 133.

An input terminal of the local integrator 131 is connected to an output terminal of the loop filter 113, specifically, an output terminal of the adder 1133. An output signal from the local integrator 131 is supplied to the delay circuit 132.

The subtracter 133 subtracts the output signal from the delay circuit 132 from the output signal from the local integrator 131.

In addition, in the first embodiment, as will be described in detail later, the PLL circuit 100 is configured in such a way that the replica integrator 131 and the subtracter 133 are implemented in the digital domain, and are made an accumulator and a subtracter each using two's complement as an expression of a numerical number thereof, respectively, thereby carrying out the dead time compensation.

Hereinafter, the Kalman type PLL circuit having the configuration described above will be considered.

When the state in which the PLL circuit 100 is equilibrium is considered, the input signal to the VCO 114 has a constant value proportional to a difference between the input frequency and the VCO free-run frequency.

This level agrees with a level of the output signal from the portion 1131 for obtaining the integral term (βΣ) within the loop filter 113. The replica integrator 131 of the VCO integrates the same signal as the input signal to the VCO 114, and thus a value obtained by multiplying a slew rate of the integrated signal by dead time, L, becomes a phase offset.

Then, when the output signal from the portion 1131 for obtaining the integral term (βΣ) in the loop filter 113 is subtracted from the dead time difference in the subtracter 136 in terms of a correction path, the phase offset can be canceled.

It is noted that even when the output signal itself from the VCO 114 is used, the same principles ought to be used in terms of an operation. However, the actual characteristics in this case have a tendency to be slightly inferior to the case of the correction path.

The signal processing portion is digital, thereby coping with the problem about the overflow in the replica integrator 131 of the VCO 114.

This digital implementation is reflected in the configuration of the block diagram shown in FIG. 2, and thus the portions from the output terminal of the phase detector 111 to the input terminal of the VCO 114 are digital.

Along with this digital implementation, in FIG. 2, the dead time, L, is expressed in the form of L steps of delays instead of being expressed in the form of the time, and the replica integrator 131 is expressed in the form of the accumulator Σ.

In addition, in the first embodiment, the internal signal of the PLL circuit 100 is expressed in the form of a two's complement.

The expression of the two's complement has such a property that even when the overflow occurs, the result of the arithmetic substraction is proper unless the difference exceeds a half of the expression range.

By utilizing the property, the proper difference is obtained as long as the signal expression has a sufficient width.

This property will now be described by giving a simple example.

Let us consider the case where a data width is 4 bits, and the data of an addition circuit of the replica integrator 131 of the VCO 114 becomes large by 3LSB (Least Significant Bit) while the data passes through the delay circuit 132.

When the output signal from the replica integrator 131 of the VCO 114 is taken to be "a," the output signal, b, from the delay circuit 132 expressed by b=a−3.

When "a" overflows from binary value (0111=7 in decimal), "a" makes wraparound to {1000 (=−8 in decimal)}.

A subtracter of (a−b) is a mechanism for carrying out full addition by obtaining two's complement.

All the cases are calculated as expressed by TABLE 3.

Table 1 shows that desired result can be obtained regardless of existence or nonexistence of overflows.

TABLE 1

| a | b | complement of B | a − b |
|---|---|---|---|
| 1000 | 0101 | 1011 | 0011 |
| 1001 | 0110 | 1010 | 0011 |
| 1010 | 0111 | 1001 | 0011 |
| 1011 | 1000 | 1000 | 0011 |
| 1100 | 1001 | 0111 | 0011 |
| 1101 | 1010 | 0110 | 0011 |
| 1110 | 1011 | 0101 | 0011 |
| 1111 | 1100 | 0100 | 0011 |
| 0000 | 1101 | 0011 | 0011 |
| 0001 | 1110 | 0010 | 0011 |
| 0010 | 1111 | 0001 | 0011 |
| 0011 | 0000 | 0000 | 0011 |
| 0100 | 0001 | 1111 | 0011 |
| 0101 | 0010 | 1110 | 0011 |
| 0110 | 0011 | 1101 | 0011 |
| 0111 | 0100 | 1100 | 0011 |

The PLL circuit 100 of the first embodiment positively adopts this property of the expression of the two's complement, thereby dissolving the overflow problem.

A minimum amount of necessary bit width can be said as a width within which double of a product of the expression (VCO input conversion) of a frequency error which needs to be followed in terms of the PLL, and the dead time, L, can be expressed.

Since this width changes depending on the setting of the VCO gain, it is preferable that the actual design has several extra bits for safer side.

It is noted that although the VCO 114 is expressed by a continuous system symbol in FIG. 2, the VCO 114 may be expressed by a discrete system from a request made from the implementation, and may also be embodied by a virtual module such as Interpolated Timing Recovery (ITR).

It is taken for granted that in any of these changes, there is no essential change required in the present invention.

Next, a transfer function of the Kalman type PLL circuit 100 shown in FIG. 2 will be calculated.

The following substitutions are carried out as expressed by Expression (2):

$$z^{-L} \to e^{-sLT} \qquad (2)$$
$$\Sigma \to \frac{1}{sT}$$

where T is a clock period.

As a result, Expression (3) is obtained as a transfer function of an equivalent continuous time system:

$$\frac{y}{r} = \frac{KiKv(\alpha s + \beta/L)\exp(-sLT)}{s^2 + KiKv(\alpha s + \beta/T)} \qquad (3)$$

It is understood from Expression (3) that the dead time disappears in the denominator similarly to the case of the PLL circuit based on the original Smith method.

The reason that in FIG. 2, the proportional term in the portion 1132 of the loop filter 113 is taken to be {α+βL} is because a first-order term coefficient in the denominator is made to correspond to α instead of {α+βL}.

In other words, in order to obtain the same damping factor ζ in the Kalman type PLL circuit with the ordinary PLL, the proportional term in the portion 1132 of the loop filter 113 needs to become large by βL.

2. Second Embodiment of PLL Circuit

Figure 3:
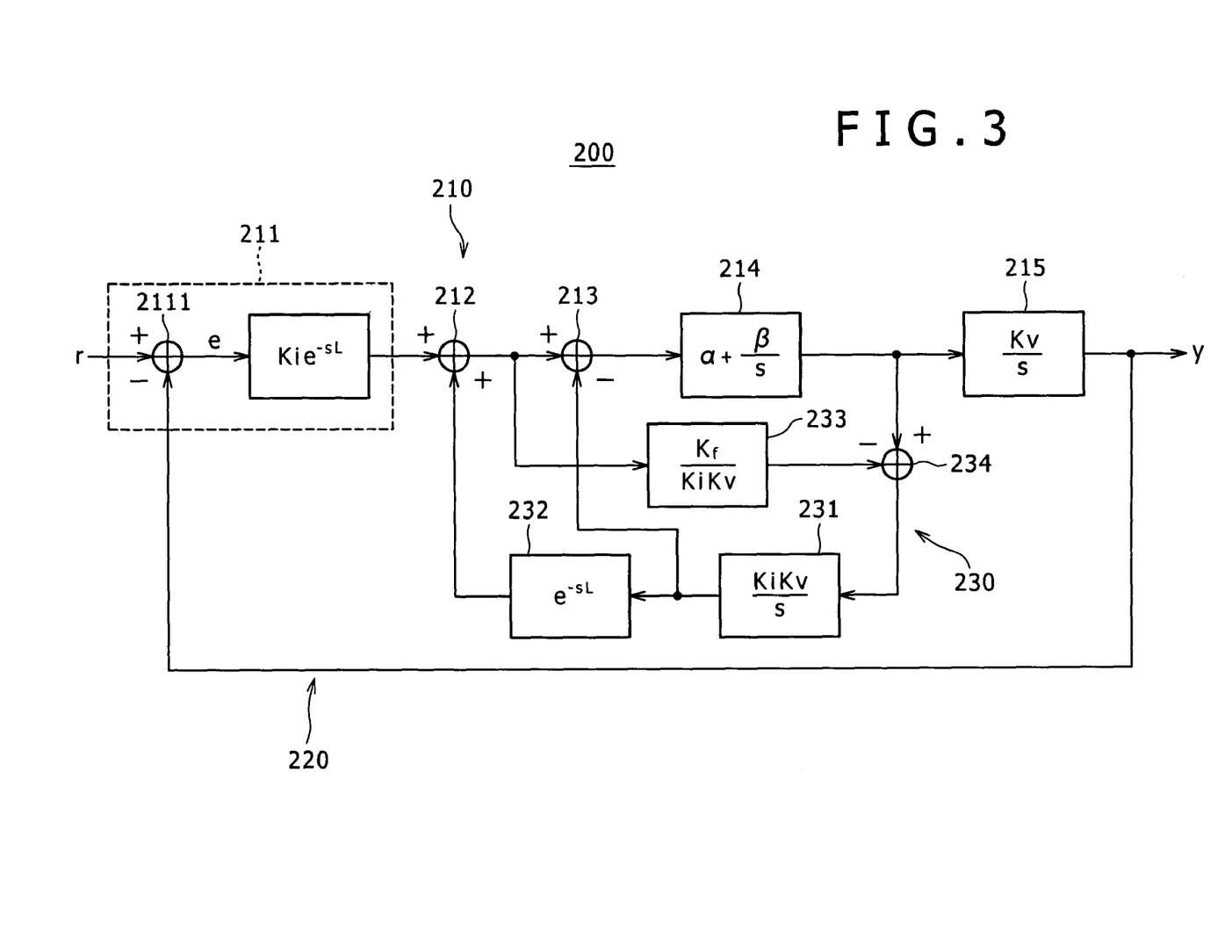
FIG. 3 is a block diagram, partly in circuit, showing a configuration of a PLL circuit according to a second embodiment of the present invention.

FIG. 3 is a block diagram, partly in circuit, showing a configuration of a PLL circuit according to a second embodiment of the present invention.

A method of subtracting a residual phase error from the input signal to the VCO replica is the idea, which is different from that for the Kalman type PLL circuit 100 of the first embodiment.

Although the configuration based on this method is partially similar to that found in the Non-Patent Document 1 (the paper by M. R. Matausek and A. D. Micic) introduced previously herein, their method cannot be used in the PLL circuit because their correction is carried out for the main path.

A PLL circuit 200 of the second embodiment has a characteristic configuration such that a correction system is inserted into the input on the replica.

The PLL circuit 200 of the second embodiment is referred to as an M3 type PLL circuit because the exact spelling of their names is difficult, using the accent symbols. So the PLL circuit 200 is simply named from initials of Modified Matausek-Micic.

FIG. 3 shows a preferred configuration of the M3 PLL circuit.

In this case, a continuous time transfer function is used.

The reason for this is because although it is supposed that the M3 PLL circuit 200 is also expressed in the form of the discrete time system in the digital implementation, unlike the Kalman type PLL circuit 100, it is unnecessary to utilize the characteristics of the fixed point representation.

The PLL (Phase Locked Loop) circuit 200 includes a main path 210, a main feedback path 220, and a local feedback path 230, and is configured in the form of a negative feedback type signal processing system having dead time within the loop.

In the main path 210, a phase detector 211, an adder (subtracter) 212, a subtracter (first subtracter) 213, a loop filter 214, and a VCO 215 are disposed in this order from an input side of an input signal r.

Also, an output signal y from the VCO 215 is fed back to an adder (subtracter) 2111 provided in the phase detector 211 through the main feedback path 220.

The phase detector 211 detects a phase of the input signal r, and a phase of the actual signal y.

The loop filter 214 has a role of determining the response characteristics of the loop.

The VCO 215 oscillates at a frequency corresponding to the output signal from the loop filter 214 to generate an oscillation signal, and outputs the oscillation signal as an actual signal to each of a signal processing system in a subsequent stage not shown, and the main feedback path 220.

The local feedback path 230 includes a replica integrator 231 and a delay circuit 232. In this case, the replica integrator 231 corresponds to a replica of the VCO 215. Also, the delay circuit 232 delays the output signal from the replica integrator 231 by circuit dead time.

The local feedback path 230 has a constant multiplication circuit 233 which is connected to the output side of the loop filter 214 in a cascade style, and which multiplies the output signal from the adder 212 by a constant value.

The local feedback path 230 has a subtracter (second subtracter) 234 for subtracting the output signal from the constant multiplication circuit 233 from the output signal from the loop filter 214, and inputting a resulting subtraction signal to the replica integrator 231.

One of points of difference of the M3 type PLL circuit 200 of the second embodiment from the Kalman type PLL circuit 100 of the first embodiment is that difference circuits before and after the input terminal of the delay circuit 232 for the dead time are implemented in the form of the adder 212 and the subtracter 213 in the main path 210 in a divided manner.

That is to say, in the M3 type PLL circuit 200, the adder 212 and the subtracter 213 are disposed in series with each other in a preceding stage of the input terminal of the loop filter 214. The delay signal from the delay circuit 232 is input to the adder 212, and the signal before being input to the delay circuit 232 is input to the subtracter 213.

Also, in the M3 type PLL circuit 200, a signal which is obtained by subtracting the output signal, from the adder 212, multiplied by the constant value from the output signal from the loop filter 214 in the subtracter 234 disposed in a preceding stage of the input terminal of the replica integrator 231 is input to the replica integrator 231.

As described above, in the M3 type PLL circuit 200, the difference circuits before and after the delay circuit 232 for the dead time are implemented in the main path 210 in the division manner.

The output signal from the adder 212 in a first stage is a sum of a real phase error from the phase detector 211, and a phase error produced by the replica integrator 231.

The sum is multiplied by a suitable coefficient, and is subtracted from the input signal to the replica integrator 231 in the subtracter 213.

Since the settling is not obtained unless the level of the input signal to the replica integrator 231 becomes zero, the settling is obtained at a time point when a certain ratio is obtained between the output signal from the loop filter 214, that is, the frequency error, and the output signal from the adder 212 for the phase.

The settling is not obtained unless the input signal to the loop filter 214 also becomes zero. However, at this time, since the output signal from the replica integrator 231 has a constant value, that is, the signals before and after the delay circuit 232 have the same value, the settling is obtained at a time point when the level of the output signal from the phase detector 211 also becomes zero, that is, the phase error becomes zero.

As described above, in the M3 type PLL circuit 200 of the second embodiment, the residual phase error compensation is provided for the local feedback loop.

On the other hand, the phase compensation made by the Kalman type PLL circuit 100 of the first embodiment can be said as the feed forward compensation.

In addition, since in the M3 type PLL circuit 200 of the second embodiment, no internal state of the loop filter is used, the form of the loop filter is more freely chosen.

Since the output signal from the replica of the VCO 215 converges into a finite amount, it is possible to naturally cope with the analog implementation.

A transfer function of the M3 type PLL circuit 200 is expressed by Expression (4):

$$\frac{y}{r} = \frac{KiKv(\alpha s + \beta/L)\exp(-sLT)}{s^2 + KiKv(\alpha s + \beta/T)} \frac{s + Kf}{s + Kf\exp(-sLT)} \quad (4)$$

In this case, the dead time term remains in a denominator. For this reason, Kf cannot be made large so much.

Thus, although the response speed of the M3 type PLL circuit 200 is inferior to that of the Kalman type PLL circuit 100 in principle, it is confirmed from the detailed simulation using the actual signal that a performance difference between the M3 type PLL circuit 200 and the Kalman type PLL circuit 100 is merely slight.

As has been described so far, according to the first and second embodiments of the present invention, the following effects can be obtained.

That is to say, according to the first and second embodiments of the present invention, it is possible to fundamentally compensate the intra-loop dead time which often results in the unstable factor in the digital PLL circuit.

As a result, the large $\omega n$ or $\zeta$ which cannot be used in the related art can be used, and thus the high speed pull-in becomes possible. In addition, it is possible to stabilize the PLL circuit.

According to the simulation, the effect of increasing the frequency pull-in range of the PLL is also found out.

Figure 4:
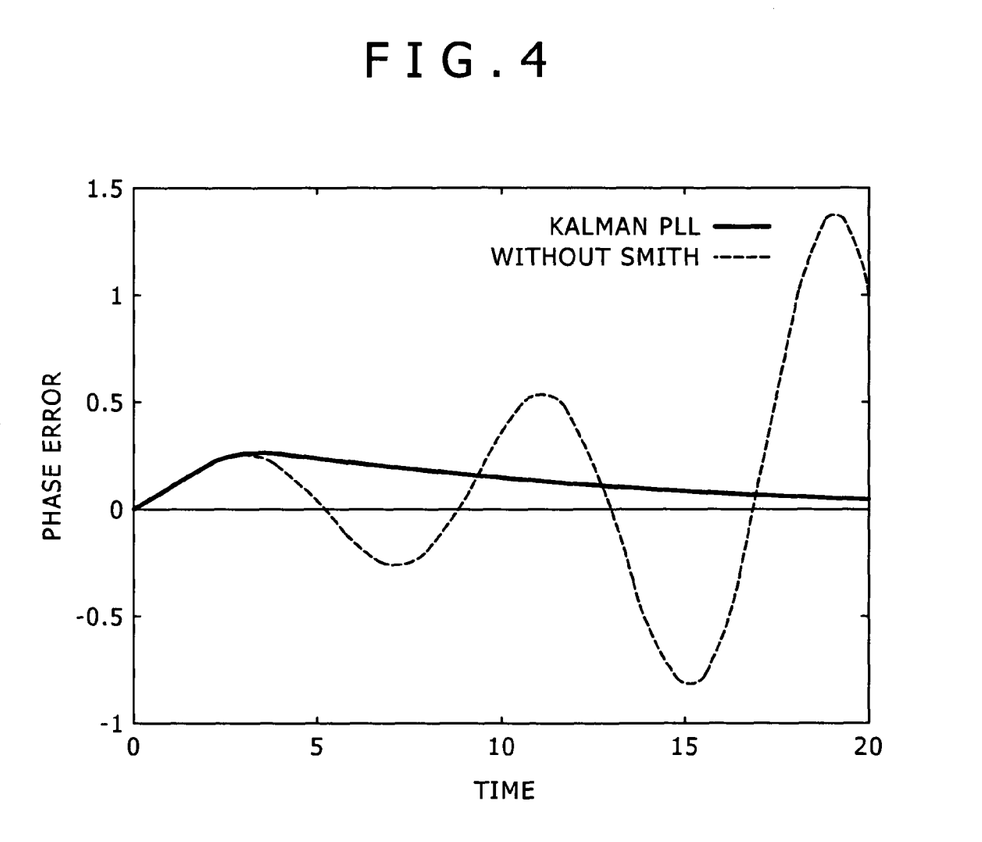
FIG. 4 is a graph showing an example of a calculation of phase error response characteristics when no dead time compensation is carried out, and an example of a calculation of phase error response characteristics when the first embodiment compensation is carried out.

FIG. 4 is a graph showing an example of a calculation of phase error response characteristics when no dead time compensation is carried out, and an example of a calculation of phase error response characteristics when the Kalman type compensation is carried out.

In FIG. 4, an axis of abscissa represents time, and an axis of ordinate represents a phase error. In addition, in FIG. 4, a curve indicated by a solid line represents the phase error response characteristics when the Kalman type compensation is carried out, and a curve indicated by a broken line represents the phase error response characteristics when no Kalman type compensation is carried out.

In this case, with a period of T=0.1, 20T is supposed as the dead time. Also, KiKv is set as 0.1, and β is set as 0.01. Also, a is set as 1.0 when no dead time compensation is carried out, and a is set as 1.2 when the dead time compensation is carried out so that the damping factors become identical to each other between both when no dead time compensation is carried out and when the Kalman type compensation is carried out.

Since the simulation which will be shown below uses a linear model, the pull-in range of the phase detector 111 is not modeled.

For this reason, although a set value for the phase error is not important because a scale of the axis of ordinate has merely to be changed, $2\pi$ rad/s is given as the slew rate of the input signal, and 0.1 rad/s is given as the phase error.

Figure 5:
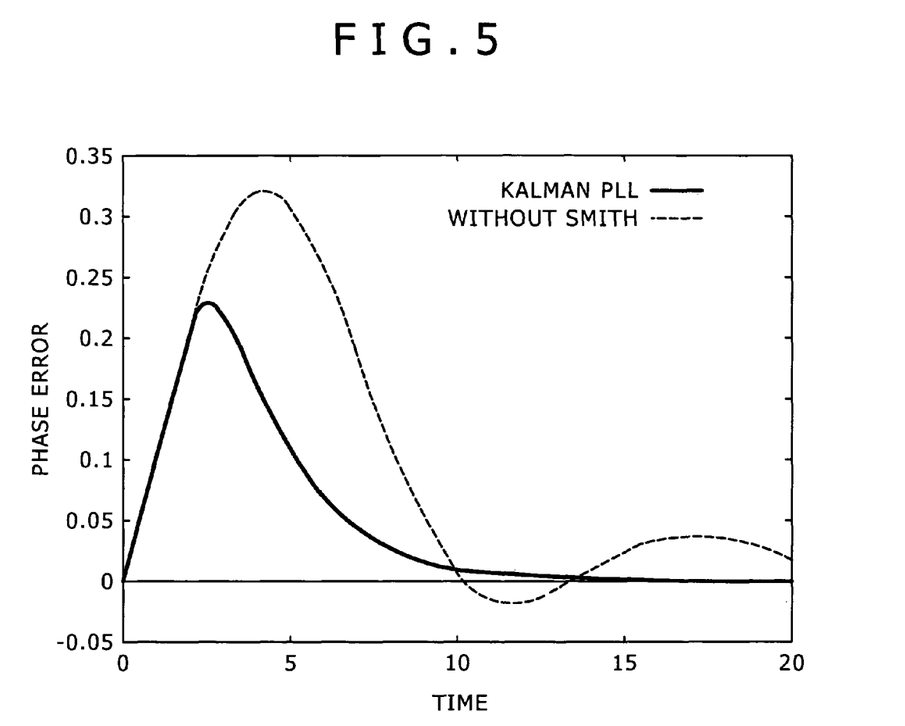
FIG. 5 is a graph showing characteristics when parameters with which excellent response characteristics are respectively obtained are searched for by adjusting $\alpha$ and $\beta$.

When parameters with which excellent response characteristics are respectively obtained are searched for by adjusting α and β, the characteristics as shown in FIG. 5 are obtained.

In the case of the Kalmam type PLL circuit 100, α=2.5 and β=0.05. Also, in the case of the simulation in which no dead time compensation is carried out, α=0.4 and β=0.005.

From the above, the effect of the dead time compensation is obvious. On the other hand, it should be noted that the target values of α and β with which the suitable response is obtained are quite different from each other. Also, the target values of β are different between when no dead time compensation is carried out and when the Kalman type compensation is carried out by one digit.

Figure 6:
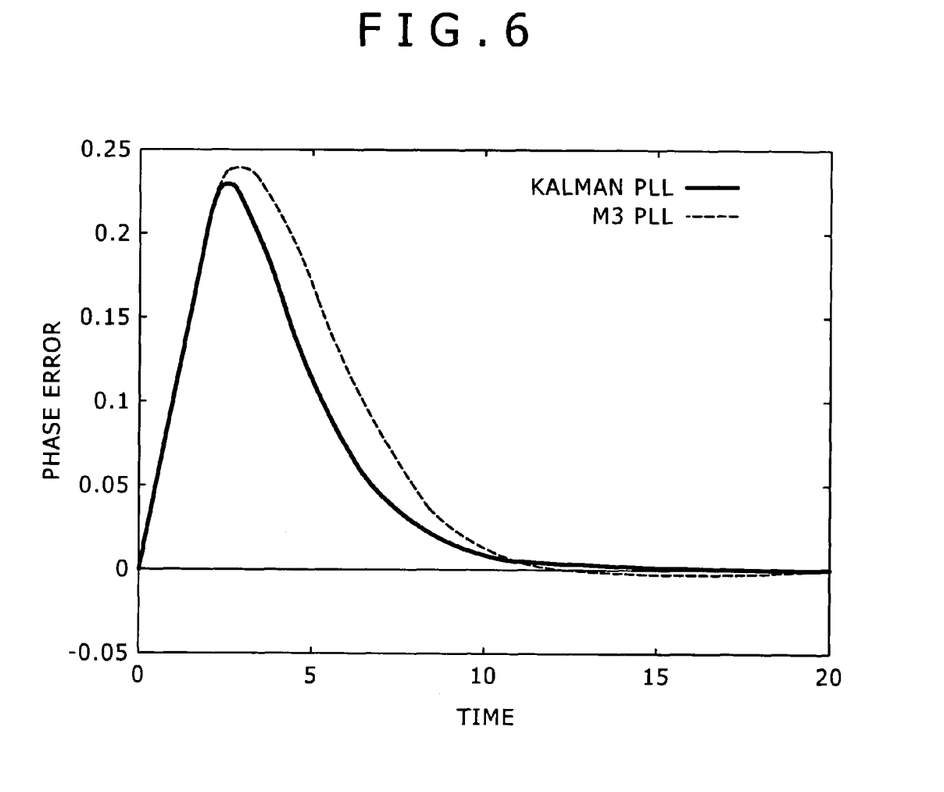
FIG. 6 is a graph showing response characteristics of the first embodiment PLL circuit, and the second embodiment PLL circuit.

FIG. 6 is a graph showing response characteristics of the Kalman type PLL circuit 100, and the M3 type PLL circuit 200.

In FIG. 6, a curve indicated by a solid line represents the response characteristics of the Kalman type PLL circuit 100, and a curve indicated by a broken line represents the response characteristics when the M3 type PLL circuit 200.

The response of the Kalman type PLL circuit 100 is identical to that shown in FIG. 5.

In the M3 type PLL circuit 200, a is set as 2.0, and a damping constant is made equal to that in the Kalman type PLL circuit 100.

The value of β in the Kalman type PLL circuit 100 and the M3 type PLL circuit 200 are each set as 0.05, and the value of Kf/(KvKi) of the M3 type PLL circuit 200 is set as 0.2. Although the response of the M3 type PLL circuit 200 is slightly slow than that of the Kalman type PLL circuit 100 as indicated by the theory, this difference is not so large.

The present application contains subject matter related to that disclosed in Japanese Priority Patent Application JP 2009-157256 filed in the Japan Patent Office on Jul. 1, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A Phase Locked Loop circuit, comprising:
   a main path through which an input signal is propagated, and an actual signal is output;
   a main feedback path through which the actual signal is fed back to an input stage of said main path; and
   a local feedback path through which feedback is carried out from a path middle of said main path to a path middle of an input stage side;
   said main path including
      a phase detector disposed in the input stage configured to detect phases of the input signal and the actual signal,
      a loop filter disposed on an output side of said phase detector, and
      a controlled oscillator configured to oscillate at a frequency corresponding to an output signal from said loop filter to generate an oscillation signal, thereby outputting the oscillation signal as the actual signal to said main feedback path, and
   said local feedback path including
      a replica portion to which the output signal from said loop filter is input, and which functions as a replica of said controlled oscillator,
      a delay portion configured to delay an output signal from said replica portion by circuit dead time,
      a first subtracter configured to obtain a difference between an input signal to the delay portion, and an output signal from said delay portion, and
      a second subtracter configured to subtract a signal obtained by multiplying an internal signal within said loop filter by a constant value from an output signal from said first subtracter thereby outputting a resulting signal to an input side of said loop filter.

2. The Phase Locked Loop circuit according to claim 1, wherein said loop filter contains therein an integral term,
   said replica portion is composed of an integrator corresponding to the replica of said controlled oscillator, and said second subtracter subtracts a signal obtained by multiplying the integral term in said loop filter by the constant value from the output signal from said first subtracter.

3. The Phase Locked Loop circuit according to claim 2, wherein said loop filter contains therein the integral term and a proportional term, and the proportional term contains therein a correction term.

4. The Phase Locked Loop circuit according to claim 2, wherein said local feedback path includes an amplitude adjusting portion configured to adjust an amplitude of the resulting signal from said second subtracter, and outputting the signal having the adjusted amplitude to the input side of said loop filter.

5. The Phase Locked Loop circuit according to claim 2, wherein said integrator and said first subtracter are both subjected to digital implementation, and are formed as an accumulator and a subtracter each using two's complement as an expression of a numerical number thereof, respectively.

6. The Phase Locked Loop circuit according to claim 1, wherein said main path includes a subtracter configured to subtract a feedback signal of said local feedback path from an output signal from said phase detector, and inputting a resulting signal to said loop filter.

* * * * *